US008895833B2

(12) United States Patent
Ukita et al.

(10) Patent No.: US 8,895,833 B2
(45) Date of Patent: Nov. 25, 2014

(54) THERMOELECTRIC DEVICE AND THERMOELECTRIC MODULE

(75) Inventors: Yasunari Ukita, Ome (JP); Jun Karasawa, Tokyo (JP); Naruhito Kondo, Kawasaki (JP); Osamu Tsuneoka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1021 days.

(21) Appl. No.: 12/964,152

(22) Filed: Dec. 9, 2010

(65) Prior Publication Data
US 2011/0139206 A1 Jun. 16, 2011

(30) Foreign Application Priority Data

Dec. 10, 2009 (JP) .................................. 2009-280609

(51) Int. Cl.
- *H01L 35/30* (2006.01)
- *H01L 35/06* (2006.01)
- *H01L 35/32* (2006.01)

(52) U.S. Cl.
CPC ................ *H01L 35/06* (2013.01); *H01L 35/32* (2013.01)
USPC .......................................... 136/205; 136/203

(58) Field of Classification Search
USPC ................................................ 136/205, 203
See application file for complete search history.

(56) References Cited

U.S. PATENT DOCUMENTS

| | | | | |
|---|---|---|---|---|
| 3,607,444 A | * | 9/1971 | DeBucs ......................... | 136/208 |
| 3,617,390 A | * | 11/1971 | De Bucs et al. ............... | 136/211 |
| 3,714,539 A | * | 1/1973 | Hampl, Jr. .................... | 322/2 R |
| 4,497,973 A | * | 2/1985 | Heath et al. ................... | 136/212 |
| 5,875,098 A | * | 2/1999 | Leavitt et al. ................. | 361/708 |
| 5,892,656 A | * | 4/1999 | Bass ............................. | 361/699 |
| 6,946,596 B2 | * | 9/2005 | Kucherov et al. ............. | 136/205 |
| 6,986,247 B1 | * | 1/2006 | Parise ............................ | 60/284 |
| 2006/0027257 A1 | * | 2/2006 | Yamaguchi et al. .......... | 136/203 |
| 2006/0042676 A1 | * | 3/2006 | Sogou et al. .................. | 136/212 |

FOREIGN PATENT DOCUMENTS

| | | |
|---|---|---|
| JP | 45-10720 | 4/1970 |
| JP | 2005-64457 | 3/2005 |
| JP | 2007-66987 | 3/2007 |
| JP | 2008-10764 | 1/2008 |

OTHER PUBLICATIONS

Takaya Nagahisa, JP 2008-010764 A, online machine translaton as provided by the Industrial Property Digital Library (IPDL) (http://www19.ipdl.inpit.go.jp/PA1/cgi-bin/PA1INDEX), translated on Dec. 12, 2013.*

(Continued)

Primary Examiner — Golam Mowla
(74) Attorney, Agent, or Firm — Oblon, Spivak, McClelland, Maier & Neustadt, L.L.P.

(57) ABSTRACT

According to one embodiment, a thermoelectric device is provided with thermoelectric elements and formed of a material capable of exhibiting the thermoelectric effect and a first electrode located at end portions of the thermoelectric elements. The first electrode includes an electrode member, a soaking member having electrical conductivity, located between the electrode member and the thermoelectric elements, and including facing portions facing the thermoelectric elements and folded portions folded back at peripheral edges of the facing portions so as to lie on the opposite side to the thermoelectric elements, and an elastic member located on the opposite side of the facing portions to the thermoelectric elements, at least a part of the peripheral edge of the elastic member being held between the folded portions and the facing portions of the soaking member.

12 Claims, 5 Drawing Sheets

(56) References Cited

OTHER PUBLICATIONS

Iwanade et al., JP 2007-066987 A, online machine translaton as provided by The Industrial Property Digital Library (IPDL) (http://www19.ipdl.inpit.go.jp/PA1/cgi-bin/PA1INDEX), translated on Dec. 12, 2013.*

Office Action issued on Nov. 1, 2011 in the corresponding Japanese Patent Application No. 2009-280609 (with Eiglish Translation).

* cited by examiner

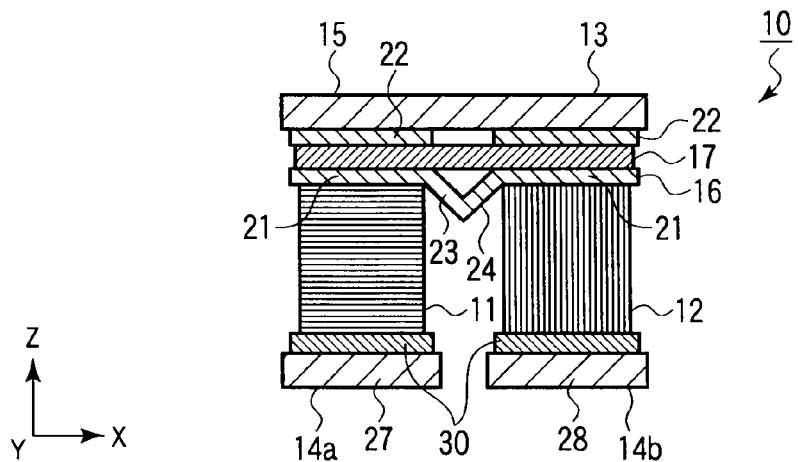
F I G. 1
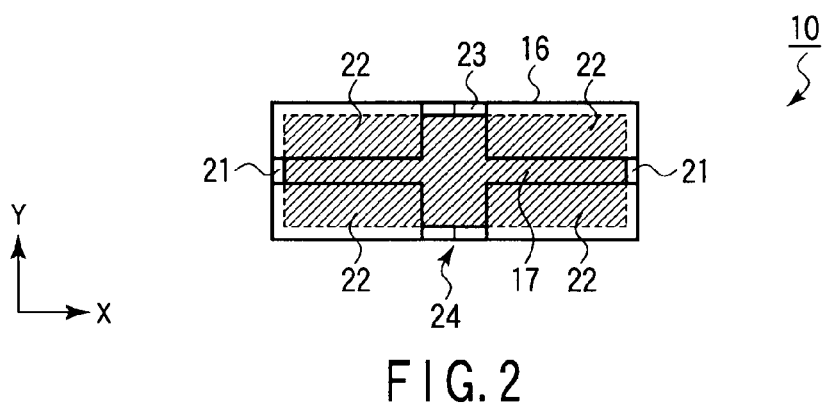
F I G. 2
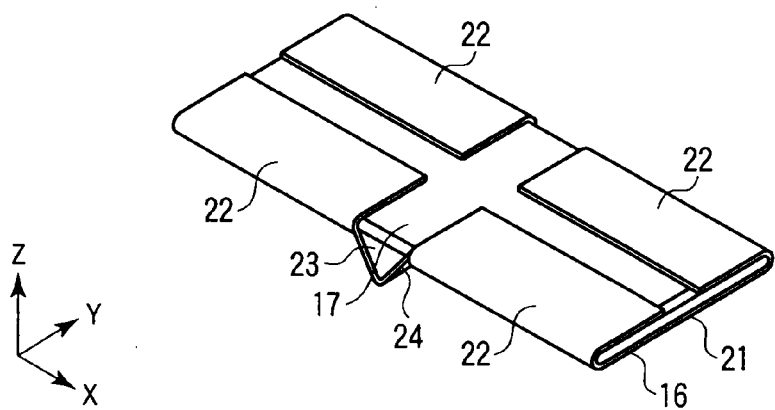
F I G. 3

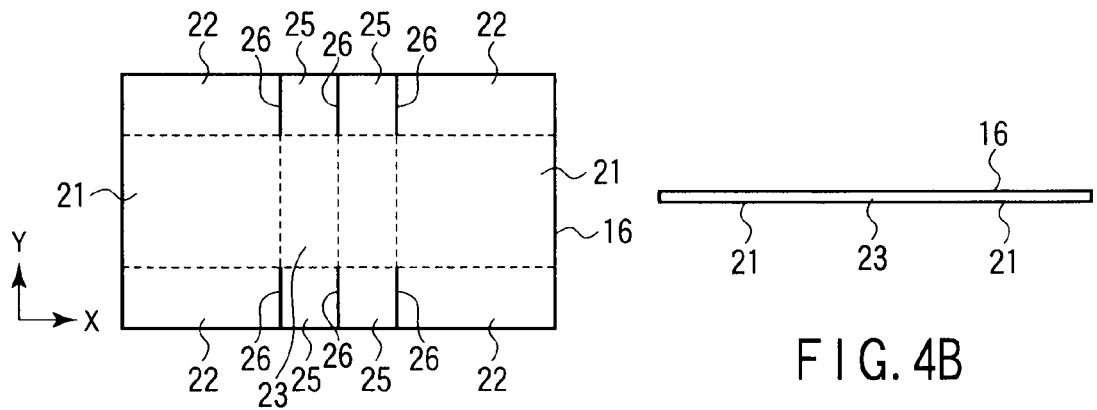
FIG. 4A
FIG. 4B
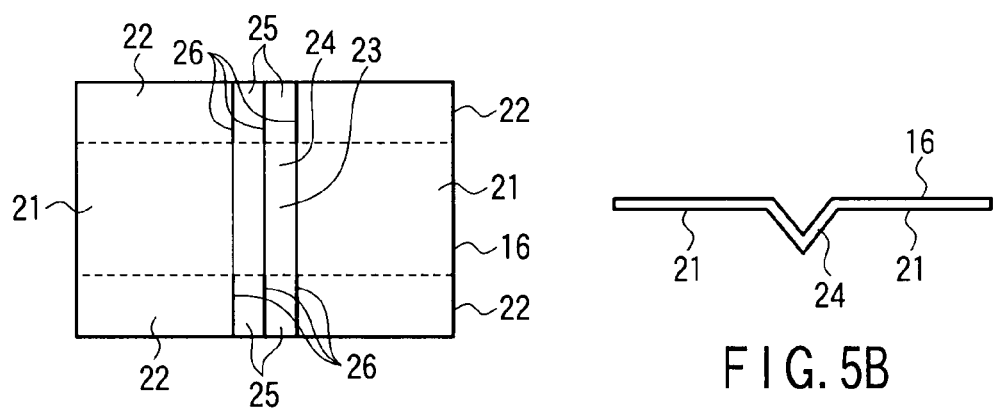
FIG. 5A
FIG. 5B
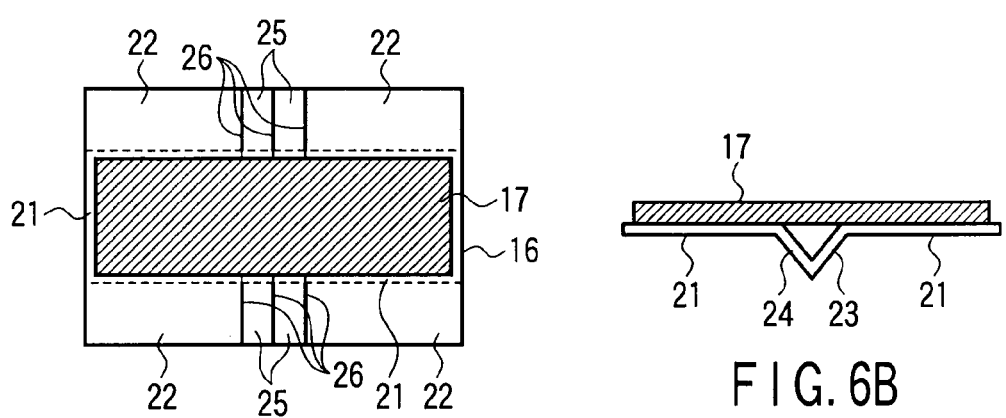
FIG. 6A
FIG. 6B

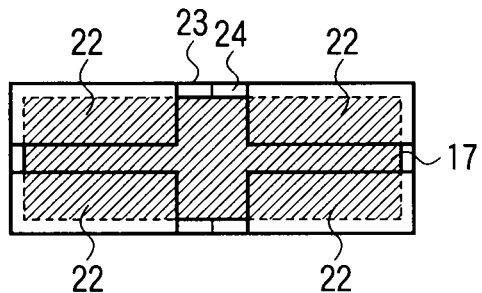 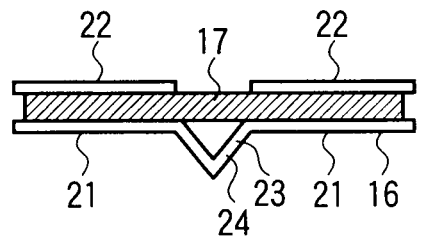
FIG. 7A  FIG. 7B
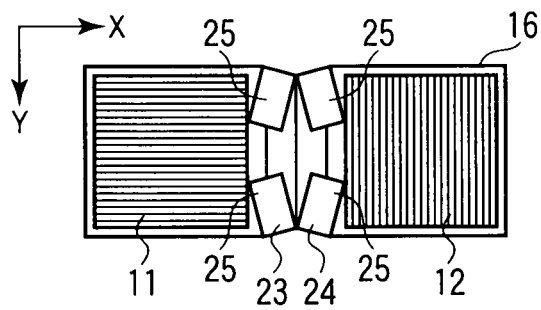
FIG. 8
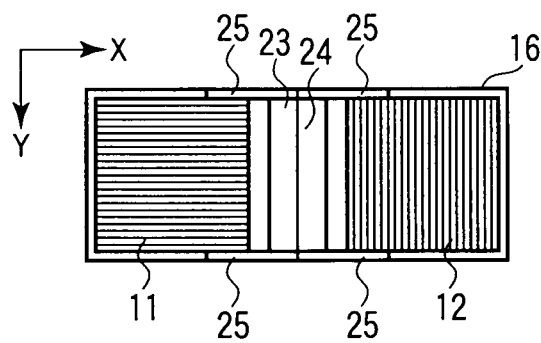
FIG. 9

THERMOELECTRIC DEVICE AND THERMOELECTRIC MODULE

CROSS-REFERENCE TO RELATED APPLICATIONS

This application is based upon and claims the benefit of priority from Japanese Patent Application No. 2009-280609, filed Dec. 10, 2009; the entire contents of which are incorporated herein by reference.

FIELD

Embodiments described herein relate generally to a thermoelectric device and a thermoelectric module.

BACKGROUND

Jpn. Pat. Appln. KOKAI Publications Nos. 2007-66987 and 2005-64457 disclose thermoelectric devices that comprise, for example, two opposite electrode members and a pair of thermoelectric elements standing between the electrode members. Thermal energy is directly converted into electrical energy, and vice versa, by means of the thermoelectric effect exhibited by the thermoelectric elements, such as the Thomson, Peltier, or Seebeck effect. Practically, a thermoelectric module is available that comprises a plurality of thermoelectric devices arranged side by side.

In one such known thermoelectric device, a plate-like soaking member and plate-like elastic member are laminated between the electrode member on the heat absorbing side and one of the thermoelectric elements.

BRIEF DESCRIPTION OF THE DRAWINGS

FIG. 1 is a sectional view showing a configuration of a thermoelectric device according to one embodiment;

FIG. 2 is a plan view showing a configuration of the thermoelectric device;

FIG. 3 is a perspective view showing a part of the thermoelectric device;

FIG. 4A is an explanatory view showing a manufacturing process of the thermoelectric device;

FIG. 4B is an explanatory view showing a manufacturing process of the thermoelectric device;

FIG. 5A is an explanatory view showing a manufacturing process of the thermoelectric device;

FIG. 5B is an explanatory view showing a manufacturing process of the thermoelectric device;

FIG. 6A is an explanatory view showing a manufacturing process of the thermoelectric device;

FIG. 6B is an explanatory view showing a manufacturing process of the thermoelectric device;

FIG. 7A is an explanatory view showing a manufacturing process of the thermoelectric device;

FIG. 7B is an explanatory view showing a manufacturing process of the thermoelectric device;

FIG. 8 is an explanatory view showing a manufacturing process of the thermoelectric device;

FIG. 9 is an explanatory view showing a manufacturing process of a thermoelectric device according to another embodiment;

DETAILED DESCRIPTION

Figure 10:
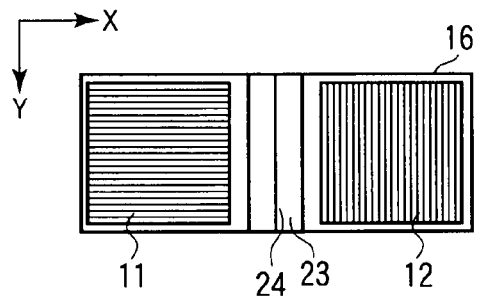
FIG. 10 is an explanatory view showing a manufacturing process of a thermoelectric device according to another embodiment.

In general, according to one embodiment, a thermoelectric device comprises a thermoelectric element comprising a material capable of exhibiting the thermoelectric effect and a first electrode located at one end of the thermoelectric element. The first electrode comprises, in a laminated manner, an electrode member, a soaking member having electrical conductivity, located between the electrode member and the thermoelectric element, and comprising a facing portion facing the thermoelectric element and a folded portion folded back at a peripheral edge of the facing portion so as to lie on the opposite side to the thermoelectric element, and an elastic member located on the opposite side of the facing portion to the thermoelectric element, at least a part of the peripheral edge of the elastic member being held between the folded portion and the facing portion of the soaking member.

A thermoelectric device 10 and thermoelectric module 100 according to one embodiment of the present embodiment will now be described with reference to FIGS. 1 to 10. In each of these schematic drawings, structures are enlarged, reduced, or omitted as required for ease of explanation. In these drawings, arrows X, Y and Z individually indicate three orthogonal directions.

FIGS. 1 to 3 are sectional, plan, and perspective views, respectively, showing the structure of the thermoelectric device 10 according to the one embodiment. The thermoelectric device 10 of the present embodiment comprises a pair of thermoelectric elements 11 and 12 and first to third electrodes 13, 14a and 14b. The thermoelectric elements 11 and 12 are formed of a material capable of exhibiting the thermoelectric effect. The first electrode 13 is located on one side (upper side) of the thermoelectric elements 11 and 12 with respect to the Z-direction. The second electrode 14a is located on the other side (lower side) of the thermoelectric element 11 with respect to the Z-direction. The third electrode 14b is located on the other side (lower side) of the thermoelectric element 12 with respect to the Z-direction.

The pair of thermoelectric elements 11 and 12 are spaced apart from each other in the X-direction and stand between the first electrode 13 and the second and third electrodes 14a and 14b. The thermoelectric elements 11 and 12 are individually formed of thermoelectric materials capable of exhibiting the thermoelectric effect, such as the Peltier, Seebeck, or Thomson effect. A material capable of exhibiting the thermoelectric effect may, for example, be a substance that contains a bismuth-tellurium or bismuth-antimony compound as its main phase. Alternatively, the material may be a substance that contains, as its main phase, a filled-Skutterudite compound, in which voids in a CoSb3 compound crystal with a Skutterudite crystal structure are filled with a chemical element, or a half-Heusler compound having an MgAgAs crystal structure. Alternatively, moreover, the material capable of exhibiting the thermoelectric effect may be a clathrate compound containing barium and gallium. Further, the material may be a mixture or complex of these substances. These substances are characterized by their relatively low thermal conductivities. If the thermoelectric elements 11 and 12 are formed of these substances, therefore, the temperature gradient can be easily maintained within them, so that the performance of the thermoelectric device 10 can be improved. For example, the thermoelectric elements 11 and 12 are n- and p-type conductors, respectively.

The first electrode 13 is formed by laminating an electrode member 15, soaking member 16, and elastic member 17 in the Z-direction. The first electrode 13 is designed to cover the respective one-side end faces of the thermoelectric elements 11 and 12 in the Z-direction.

The soaking member 16 is formed by bending a thin plate-like member and is electrically conductive. The soaking member 16 is more thermally conductive than the thermoelectric elements 11 and 12. Specifically, the soaking member 16 is formed of a thin plate material such as a metal foil.

Preferably, moreover, the soaking member 16 is formed of a thin plate of iron, nickel, tantalum, titanium, tungsten, molybdenum, niobium, copper, or carbon, which is relatively low-priced and highly thermally conductive. Alternatively, the soaking member 16 may be formed of a substance consisting mainly of any of these elements or an alloy, compound, or mixture consisting of two or more of these substances or elements. Further, the soaking member 16 may be formed by affixing together two or more of the elements, substances, or alloy or the like described above.

The soaking member 16 integrally comprises a pair of facing portions 21, folded portions 22, and junction 23. The facing portions 21 are individually in contact with the respective one end faces (upper surfaces as illustrated in the drawings) of the thermoelectric elements 11 and 12. The folded portions 22 are folded back at the peripheral edges of the facing portions 21 and lie on the opposite side to the thermoelectric elements 11 and 12. The junction 23 is formed so as to connect the facing portions 21 and penetrate between the thermoelectric elements 11 and 12.

Each of the facing portions 21 has a shape corresponding to the one end face of its corresponding thermoelectric element 11 or 12, which is rectangular in this example. The junction 23, which is located between the facing portions 21, is bent V-shaped so as to penetrate a gap between the thermoelectric elements 11 and 12 and form a recess 24 depressed in the Z-direction between the elements 11 and 12. The recess 24 is configured to regulate the relative positions of the thermoelectric elements 11 and 12.

The opposite end edges of the facing portions 21 in the Y-direction constitute the folded portions 22 that are folded back so as to cover the end edges of the elastic member 17.

The elastic member 17 is a rectangular, electrically conductive plate having predetermined elasticity. The elastic member 17 is designed so as to be more easily deformable than the thermoelectric elements 11 and 12. Specifically, it is advisable to make the elastic member 17 reticulate, latticed, or honeycomb. The elastic member 17 used in the present embodiment is formed of a braided wire, such as a metal wire net. The intrinsic elastic modulus of the material of the elastic member 17 should preferably be higher than those of the materials of the thermoelectric elements 11 and 12 and electrode member 15, though this is not limitative. If the elastic member 17 has any of the above-described shapes, its elasticity can be higher, as a whole, than that of the thermoelectric elements 11 and 12 and equal to or higher than that of the electrode member 15, without regard to the elastic modulus of the material.

The elastic member 17 is located in contact with those surfaces of the facing portions 21 opposite to the thermoelectric elements 11 and 12. The elastic member 17 is configured to cover the junction 23 and the facing portions 21 of the soaking member 16 from above. The end edges of the elastic member 17 in the Y-direction is covered by the folded portions 22 of the soaking member 16, and the end edge portions of the elastic member 17 are sandwiched between the folded portions 22 and the facing portions 21 of the soaking member 16. With this configuration, the relative positions of the elastic member 17 and soaking member 16 are regulated. In this example, 60% or more of the area of the upper surface of the elastic member 17 is covered by the folded portions 22.

Referring now to FIGS. 4A to 8, there will be described an example of a method for manufacturing a laminated structure of the soaking member 16 and elastic member 17 that constitutes a part of the first electrode 13. As shown in the plan and sectional views of FIGS. 4A and 4B, the soaking member 16 in an unbent state is a thin rectangular plate. In the soaking member 16, the pair of facing portions 21 arranged side by side in the X-direction, the junction 23 connecting the facing portions 21, and a pair of strip portions 25 at the Y-direction opposite end portions of the junction 23 are lined up into one plate-like structure. In order to make the folded portions 22 and strip portions 25 easily foldable, as described later, cuts 26 in the Y-direction are previously made between the strip portions 25 and folded portions 22 and in the X-direction center of the strip portions 25. Alternatively, the strip portions 25 may be cut off in advance, as described later.

In this state, the junction 23 in the center is bent like a valley such that the recess 24 depressed in the Z-direction is formed, as shown in FIGS. 5A and 5B.

Then, the elastic member 17 is mounted on the upper surface of the central portion of the soaking member 16, as shown in FIGS. 6A and 6B. When this is done, the elastic member 17 is located so as to face the facing portions 21 and junction 23.

As shown in FIGS. 7A and 7B, moreover, the folded portions 22 on the opposite end edges of the facing portions 21 are bent upward and folded back so as to cover the upper surface of the elastic member 17. In this way, the elastic member 17 is held by the soaking member 16 to form an integral structure.

As this is done, the rectangular strip portions 25 are individually formed at the Y-direction end edges of the junction 23 and between the folded portions 22 that are arranged side by side in the Y-direction. As shown in the bottom view of FIG. 8, for example, the strip portions 25 are located between the thermoelectric elements 11 and 12 that are paired when bent. In this case, the strip portions 25 that are located between the two thermoelectric elements 11 and 12 serve as stops against vertical dislocation of the soaking member 16. In other words, the strip portions 25 make the soaking member 16 less susceptible to dislocation. Further, the strip portions 25 may be either bent outside the thermoelectric elements 11 and 12, as shown in the bottom view of FIG. 9, or cut and removed, as shown in the bottom view of FIG. 10. FIGS. 8 to 10 are bottom views showing the soaking member 16 on the thermoelectric elements 11 and 12. The perspective view of FIG. 3 shows the case where the strip portions 25 are cut off.

The plate-like electrode member 15 is further laminated on the laminated structure of the soaking member 16 and elastic member 17 arranged in this manner. The first electrode 13 is configured to cover the respective upper end faces of the thermoelectric elements 11 and 12. Specifically, the soaking member 16 is located on the pair of thermoelectric elements 11 and 12, the elastic member 17 is located on the soaking member 16 so as to be held by the folded portions 22 thereof, and the electrode member 15 is mounted on the upper surface of the elastic member 17. The first electrode 13 is neither joined nor adhesively bonded to the thermoelectric elements 11 and 12 but only contacts them.

The second electrode 14a comprises an electrode member 27 and is located below the one thermoelectric element 11, an n-type conductive portion. The third electrode 14b comprises an electrode member 28 and is located below the other thermoelectric element 12, a p-type conductive portion.

In the present embodiment, the second and third electrodes 14a and 14b are joined, with a bonding material 30 such as solder, to those respective end faces (lower surfaces as illustrated in the drawings) of the thermoelectric elements 11 and 12 opposite to the surfaces thereof in contact with the soaking member 16.

If a DC voltage is applied to the first to third electrodes 13, 14a and 14b to energize them, in the thermoelectric device 10 constructed in this manner, the first electrode 13 functions as a heat radiating surface when the combination of the second and third electrodes 14a and 14b function as a heat absorbing surface, and vice versa. Thus, the thermoelectric device 10 can operate as a temperature regulator based on current control. Also, the thermoelectric device 10 can serve as a temperature measuring device. Since a potential difference is produced between the first electrode 13 and the second and third electrodes 14a and 14b, depending on a temperature difference between them, the temperature can be measured by the potential difference.

Figure 11:
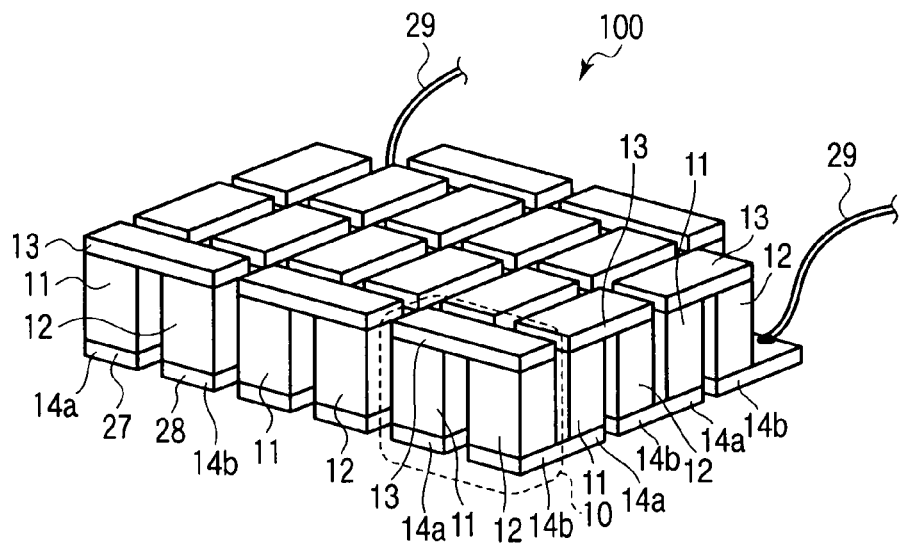
FIG. 11 is a perspective view showing a configuration of a thermoelectric module according to the embodiment of FIG. 10.

As shown in FIG. 11, the thermoelectric module 100 according to the present embodiment comprises a plurality of thermoelectric devices 10 connected in series with one another. Specifically, in the thermoelectric module 100, the second electrodes 14a on the lower sides and third electrodes 14b below the adjacent thermoelectric devices 10 are connected to one another. Further, conductors 29 are arranged so as to be connected to the second electrodes 14a of the thermoelectric devices 10 on one end side and the third electrodes 14b of the thermoelectric devices 10 on the other end side.

The thermoelectric device 10 according to the present embodiment and the thermoelectric module 100 using the same produce the following effects. Since the elastic member 17 is held by the soaking member 16 in the first electrode 13, it can be easily positioned.

Since the end edges of the soaking member 16 are folded back opposite to the thermoelectric elements 11 and 12 and located between the electrode member 15 and elastic member 17, moreover, they cannot contact each other if the thermoelectric devices 10 are arranged in a module.

Thus, in a structure that comprises hanging portions formed by bending the peripheral edges of a soaking member along the side faces of thermoelectric elements, for example, the hanging portions inevitably contact the end edges of the respective soaking members of adjacent thermoelectric devices. According to the present embodiment, however, contact with the soaking members of adjacent thermoelectric devices can be prevented.

Since the end edges of the facing portions 21 are folded back to hold the elastic member 17, moreover, pressure in the direction of lamination can be uniformly applied to portions corresponding to the thermoelectric elements 11 and 12.

Thus, if only the end edge portions of the junction are folded back, for example, a force of contact is concentrated on the junction, and a sufficient pressure is not applied to the thermoelectric elements 11 and 12, so that electrical connection is difficult. According to the present embodiment, however, the peripheral edge portions of the thermoelectric elements 11 and 12 are folded back and laminated on the elements. In this way, electrical joining of the thermoelectric elements 11 and 12 and electrode member 15 can be satisfactorily maintained.

If the elastic member 17 is formed of a reticulate structure that cannot be easily drawn by a mounted device, moreover, it is integrated with the soaking member 16 so that it can be easily drawn. Thus, the elastic member 17 can be easily handled when it is introduced onto the thermoelectric elements 11 and 12, for example.

The recess 24 is formed in the central portion of the soaking member 16 and located between the paired thermoelectric elements 11 and 12 that are electrically connected. Thus, the soaking member 16 and elastic member 17 can be easily positioned and laminated in desired positions on the thermoelectric elements 11 and 12, whereby the possibility of short-circuiting can be eliminated.

Since the elastic member 17 is held by the soaking member 16, thermal and electrical conduction between the electrodes 13 and 14 can be achieved by means of a path extending through the soaking member 16 without passage through the elastic member 17, as well as a path extending through the elastic member 17. This stabilizes thermal and electrical conductivity properties. Thus, the thermoelectric conversion efficiency of the thermoelectric device 10 can be improved.

The soaking member 16 contacts the elastic member 17 and thermoelectric elements 11 and 12 and is higher than them in thermal conductivity. Therefore, thermal energy from the elastic member 17 can be transmitted to the thermoelectric elements 11 and 12 after it is equalized within the plane of the soaking member 16. If the elastic member directly contacts the thermoelectric elements, the area of contact between the thermoelectric elements and the elastic member having, for example, a reticulate shape that ensures elasticity is reduced. Thus, the thermal conduction is inhibited or the thermal uniformity is lowered. According to the present embodiment, however, the highly thermally conductive soaking member 16 can improve the thermal uniformity on the contact surfaces of itself and the thermoelectric elements 11 and 12, thereby enhancing the thermoelectric conversion efficiency.

The elastic member 17 is formed of a braided wire, such as a metal wire net, which has elasticity higher than that of the thermoelectric elements 11 and 12 and equal to or higher than that of the electrode member 15, so that it can reduce thermal stress. In other words, the elastic member 17 has a function to reduce thermal stress that is produced by the difference in thermal expansion coefficient between the electrode member 15 and thermoelectric elements 11 and 12. Thus, it is possible to solve the problem of breakage in the thermoelectric device 10 or degradation of the thermoelectric elements 11 and 12 that may be caused by thermal stress. The thermal stress can be further reduced, since the soaking member 16 is only in contact with the thermoelectric elements 11 and 12 so that they can be displaced relative to one another.

The elastic member 17 can reduce thermal stress produced in the thermoelectric device 10. Further, the soaking member 16 is provided as a means to uniformly transmit thermal energy from the elastic member 17 to the surfaces of the thermoelectric elements 11 and 12. In this way, the surface temperature distribution of the thermoelectric elements 11 and 12 can be made more uniform. Thus, the thermoelectric conversion efficiency of the thermoelectric module 100 that uses the thermoelectric device 10, as well as that of the device 10, can be improved.

According to the thermoelectric device 10 of the present embodiment, as described above, there may be provided the thermoelectric module 100, which enables a reduction in thermal stress in the thermoelectric device 10 and improvement in thermoelectric properties based on surface temperature equalization of the electrodes of the thermoelectric elements 11 and 12 and is easy to assemble and highly reliable, and a manufacturing method therefor. According to the thermoelectric device 10 and thermoelectric module 100 of the present embodiment, positioning is easy and appropriate electrical connection can be made.

The present embodiment is not limited directly to the embodiment described above, and in carrying out the embodiment, its constituent elements may be embodied in modified forms without departing from the spirit of the embodiment. In the present embodiment, for example, the thermoelectric elements 11 and 12 are arranged in a pair. Alternatively, however, the thermoelectric elements 11 and 12 may be arranged as a single part of a material capable of exhibiting the thermoelectric effect, and correspondingly, the second and third electrodes 14a and 14b may also be arranged as a single part. Also in this case, the thermoelectric device can fulfill its vital functions and achieve the above-described effects. Further, the embodiment can also be applied to a thermoelectric module that comprises a plurality of thermoelectric elements, with the same effects.

In the embodiment described above, the first electrode 13 is shown to be located on the upper side, and the elastic member 17 to be disposed on the lower surface of the electrode member 15, for ease of explanation. However, the present embodiment is not limited to this arrangement and is also applicable to the case where the members are arranged upside down. More specifically, the same effects as those of the above-described embodiment can be obtained if the laminated structure of the soaking member 16 and elastic member 17 is located below the thermoelectric elements 11 and 12 with the electrode member 15 below the resulting structure.

Figure 12:
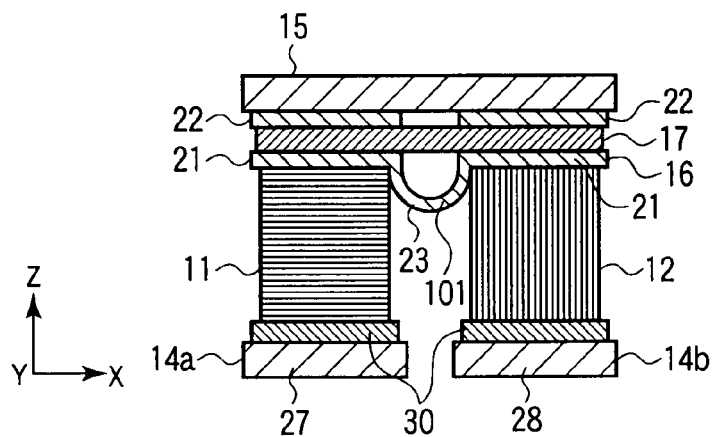
FIG. 12 is a sectional view showing a configuration of a thermoelectric device according to another embodiment.

Although the recess 24 of the soaking member 16 of the above embodiment is illustrated as being V-shaped, it is not limited to this shape. As shown in FIG. 12, for example, the recess 24 may be U-shaped, as shown in FIG. 12, or in a W-shape or any other suitable shape, with the same effects.

Figure 13:
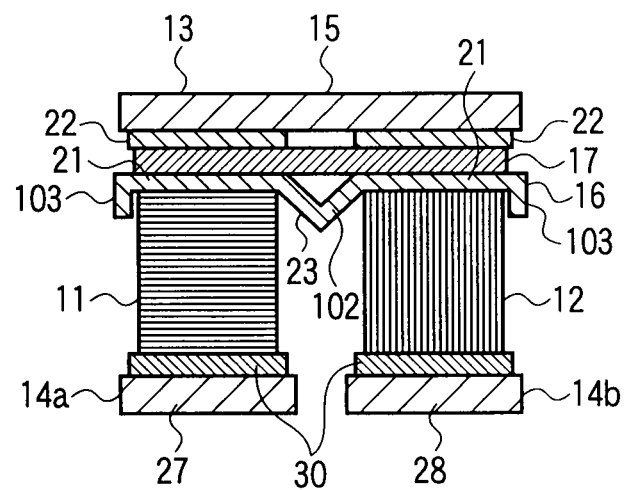
FIG. 13 is a sectional view showing a configuration of a thermoelectric device according to another embodiment.

As shown in FIG. 13, moreover, bent portions 103 that are bent toward the thermoelectric elements 11 and 12 may be formed individually on the X-direction opposite end edge portions of the soaking member 16. In this case, the bent portions 103 facilitate positioning of the soaking member 16 with respect to the thermoelectric elements 11 and 12.

Although the folded portions 22 are located at the Y-direction end edges, they may alternatively be formed by folding back any other outer peripheral portions of the facing portions 21. For example, the folded portions 22 may be formed by folding back the X-direction opposite end edges or the entire circumference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thermoelectric device comprising:
a pair of thermoelectric elements spaced apart from each other by a predetermined distance and comprising a material capable of exhibiting the thermoelectric effect; and
a first electrode located at one end of the thermoelectric element, the first electrode covering first ends of the thermoelectric elements, an electrode member,
a soaking member located between the electrode member and the thermoelectric elements, and comprising a pair of facing portions facing the thermoelectric elements, a connection portion connecting the facing portions and bent and inserted between the thermoelectric elements, and a folded portion located at a peripheral edge of the facing portions and folded away from the thermoelectric elements; and
an elastic plate member located on an opposite side of the facing portions to the thermoelectric elements, at least a part of the peripheral edge of the elastic member being held and positioned between the folded portion and the facing portions of the soaking member.

2. The thermoelectric device according to claim 1, wherein the thermoelectric elements are arranged in parallel and extend in a first direction, the soaking member comprise end portions as viewed in a second direction perpendicular to the first direction, the end portions being folded and thereby constitute the folded portion, the folded portion comprising strip portions which are folded parts of the end portions, extend in parallel to each other, and are located between the thermoelectric elements.

3. The thermoelectric device according to claim 2, wherein the elastic member is more elastic than the thermoelectric element and the electrode, and the soaking member is more thermally conductive than the thermoelectric element.

4. The thermoelectric device according to claim 1, wherein a second electrode comprising an electrode member is located on the other end side of one of the thermoelectric elements, and a third electrode comprising another electrode member is located on the other end side of the other thermoelectric element.

5. The thermoelectric device according to claim 4, wherein the elastic member is more elastic than the thermoelectric element and the second electrode and the third electrode, and the soaking member is more thermally conductive than the thermoelectric element.

6. The thermoelectric device according to claim 1, wherein the elastic member is more elastic than the thermoelectric element and the first electrode, and the soaking member is more thermally conductive than the thermoelectric element.

7. A thermoelectric module comprising the thermoelectric device according to claim 1, wherein the thermoelectric elements are electrically connected in series with one another.

8. The thermoelectric module according to claim 7, wherein a pair of the thermoelectric elements are arranged with a predetermined space therebetween, the first electrode is integrally formed so as to cover one end side of the pair of thermoelectric elements by laminating the elastic member, the electrode member, and the soaking member comprising a pair of the facing portions and the folded portion, and the soaking member comprises a junction which connects the pair of facing portions and is bent so as to penetrate a gap between the thermoelectric elements.

9. The thermoelectric module according to claim 8, wherein a second electrode comprising an electrode member is located on the other end side of one of the thermoelectric elements, and a third electrode comprising another electrode member is located on the other end side of the other thermoelectric element.

10. The thermoelectric module according to claim 7, wherein the elastic member is more elastic than the thermoelectric element and the first electrode, and the soaking member is more thermally conductive than the thermoelectric element.

11. The thermoelectric module according to claim 1, wherein the electrode member is a plate member.

12. The thermoelectric module according to claim 1, wherein the elastic member comprises one of a mesh member, a lattice member, or a honeycomb member.

* * * * *